United States Patent [19]
Furman

[11] Patent Number: 6,075,398
[45] Date of Patent: Jun. 13, 2000

[54] TUNABLE DIGITAL OSCILLATOR CIRCUIT AND METHOD FOR PRODUCING CLOCK SIGNALS OF DIFFERENT FREQUENCIES

[75] Inventor: Elliot M. Furman, Menlo Park, Calif.

[73] Assignee: S3 Incorporated, Santa Clara, Calif.

[21] Appl. No.: 09/088,645

[22] Filed: Jun. 1, 1998

[51] Int. Cl.[7] .................................................. H03K 5/13
[52] U.S. Cl. .......................................... 327/291; 227/295
[58] Field of Search ................................... 327/291, 293, 327/294, 105, 299, 107, 295

[56] References Cited

U.S. PATENT DOCUMENTS

| | | | |
|---|---|---|---|
| 5,003,194 | 3/1991 | Engelhard | 327/176 |
| 5,568,075 | 10/1996 | Curran et al. | 327/172 |
| 5,656,961 | 8/1997 | Tran et al. | 327/184 |

*Primary Examiner*—Tuan T. Lam
*Attorney, Agent, or Firm*—Fenwick & West LLP

[57] ABSTRACT

A tunable digital oscillator circuit comprises a first dual-clock pulse generator, a second dual-clock pulse generator, a run controller, a stop controller and a decoder. The first and second dual-clock pulse generators are coupled in a cascaded manner with the output of the first dual-clock pulse generator provided as an input to the second dual-clock pulse generator. Each of the first and second dual-clock pulse generators is preferably tunable, in that, they can output one clock signal from a predetermined number of frequencies. The run controller is preferably coupled to receive a start signal and the output of the second dual-clock pulse generator. The run controller provides the input to begin and maintain the first and second dual-clock pulse generators in the state of generating a clock signal. The stop controller is coupled to receive a clock signal from the first dual-clock pulse generator, and a stop signal. The tunable digital oscillator circuit can start or stop the clock within two clock cycles. The decoder receives a period select signal and provides a control signal to the first and second dual-clock pulse generators to select one of a predetermined number of frequencies for the clock signal.

20 Claims, 10 Drawing Sheets

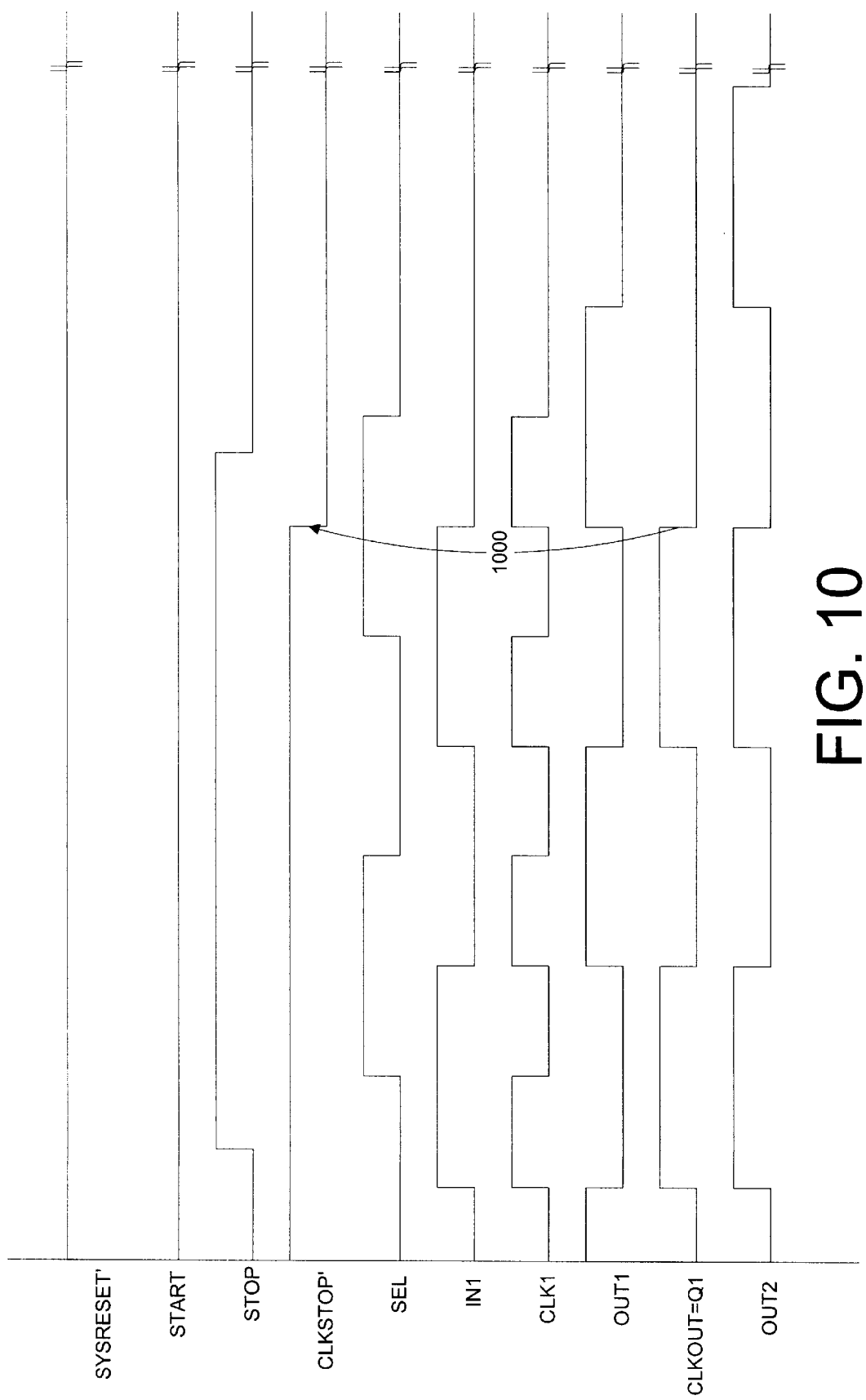

TUNABLE DIGITAL OSCILLATOR CIRCUIT AND METHOD FOR PRODUCING CLOCK SIGNALS OF DIFFERENT FREQUENCIES

BACKGROUND OF THE INVENTION

1. Field of the Invention

The present invention relates generally to systems and methods for generating clock signals. In particular, the present invention relates to a system and a method for generating clock signals of different frequencies using a tunable digital oscillator circuit. Still more particularly, the present invention relates to a tunable oscillator circuit formed exclusively from digital logic circuits.

2. Description of the Background Art

Oscillators are well known in the prior art for producing clock signals. Most conventional oscillators require some form of R-C network or resistor-capacitor combination. Such R-C networks are typically used in combination with a crystal to produce a well-defined, stable square wave output. However, one problem with such existing clock generators or oscillators is that they are difficult and expensive to include as part of an integrated circuit because of the required analog components. It is often very difficult, if not impossible, to make usable resistors and capacitors on integrated circuits, especially for certain design processes. Furthermore, the addition of such analog components to integrated circuits consumes much of the power and layout area of the integrated circuit, thereby reducing the overall amount of circuitry that can be put on one integrated circuit and increasing the cost of the die. Thus, there is a need for a system and method for producing a clock signal that does not require the conventional resistor-capacitor combinations.

Modern integrated circuits often need not just one clock signal but several clock signals of differing frequencies. One common approach is to use a phase lock loop (PLL) circuit to provide a programmable frequency output. While PLL circuits provide very precise frequency output, they create a number of problems when included as part of an integrated circuit. First, programmable oscillators constructed using PLL circuits, while very good for many applications, are very sensitive to process technologies and must often be redesigned as process technologies change. This is a particular problem for integrated circuits where the process technologies are constantly migrating to smaller sizes such as the transition from 0.35 to 0.25 micron technologies. Therefore, each time the process technology changes the programmable oscillators must be redesigned. Second, they are expensive due to the components external to the chip, such as resistors, capacitors and crystals, required to make the design work. Third, the PLL circuits consume large amounts of power and significantly increase the gate count and area consumed. Thus, there is need for a square wave digital oscillator that does not require the use of a PLL circuit.

With the advent of portable computers, power consumption has become a key focus due to the fact that batteries are able to provide only discrete and limited amounts of power. This desire to preserve power for portable computing has mandated reduced power consumption for integrated circuits. One technique used to save power is to switch clocks off when they are not needed and back the need arises. Thus, there is a need for a square wave digital oscillator that can be switched "on" and "off" very quickly. Such an oscillator would allow sub-systems of portable computers to be switched into low power mode when the sub-systems including the main system clocks are switched off. Thus, there is need for a tunable digital oscillator that can be switched on and off quickly (on within nanoseconds and off within two clock cycles). Furthermore, the switching of the tunable digital oscillator between the on and off state must be glitch or error free.

Therefore, there is a need for a square wave digital oscillator on an integrated circuit that can be tuned over a wide frequency range using standard, off the shelf, digital logic components.

SUMMARY OF THE INVENTION

The present invention overcomes the deficiencies and limitations of the prior art with a tunable, square-wave, digital oscillator on an integrated circuit. The digital oscillator of the present invention preferably comprises a first dual-clock pulse generator, a second dual-clock pulse generator, a run controller, a stop controller and a decoder. The first and second dual-clock pulse generators are coupled in a cascaded manner with the output of the first dual-clock pulse generator provided as an input to the second dual-clock pulse generator. The output of the second dual-clock pulse generator is fed back through the run controller and provided as an input to the first dual-clock pulse generator. The first and second dual-clock pulse generators together create and provide the square wave clock signal output by the present invention. Each of the first and second dual-clock pulse generators is preferably tunable, in that, they can output one clock signal from a predetermined number of frequencies. The run controller is preferably coupled to receive a start signal and the output of the second dual-clock pulse generator. The run controller provides the input to begin and maintain the first and second dual-clock pulse generators in the state of generating a clock signal. The stop controller is coupled to receive a clock signal from the first dual-clock pulse generator, and a stop signal. In response to the stop signal, the stop controller generates a signal to interrupt the first and second dual-clock pulse generators from producing a clock signal. The present invention is particularly advantageous because it can start or stop the clock within two clock cycles. The decoder receives a period select signal and provides a control signal to the first and second dual-clock pulse generators to select one of a predetermined number of frequencies for the clock signal. The present invention is also advantageous because the first dual-clock pulse generator, the second dual-clock pulse generator, the run controller, the stop controller, and the decoder are all constructed of standard digital logic circuits available in all libraries. Thus no on chip resistor or capacitor or any external components are required. The present invention further comprises a method for generating a digital clock signal.

BRIEF DESCRIPTION OF THE DRAWINGS

FIG. 10 is a timing diagram illustrating the sequence of signals generated by the present invention during stopping of the tunable digital oscillator of the present invention.

DETAILED DESCRIPTION OF THE PREFERRED EMBODIMENTS

Figure 1:
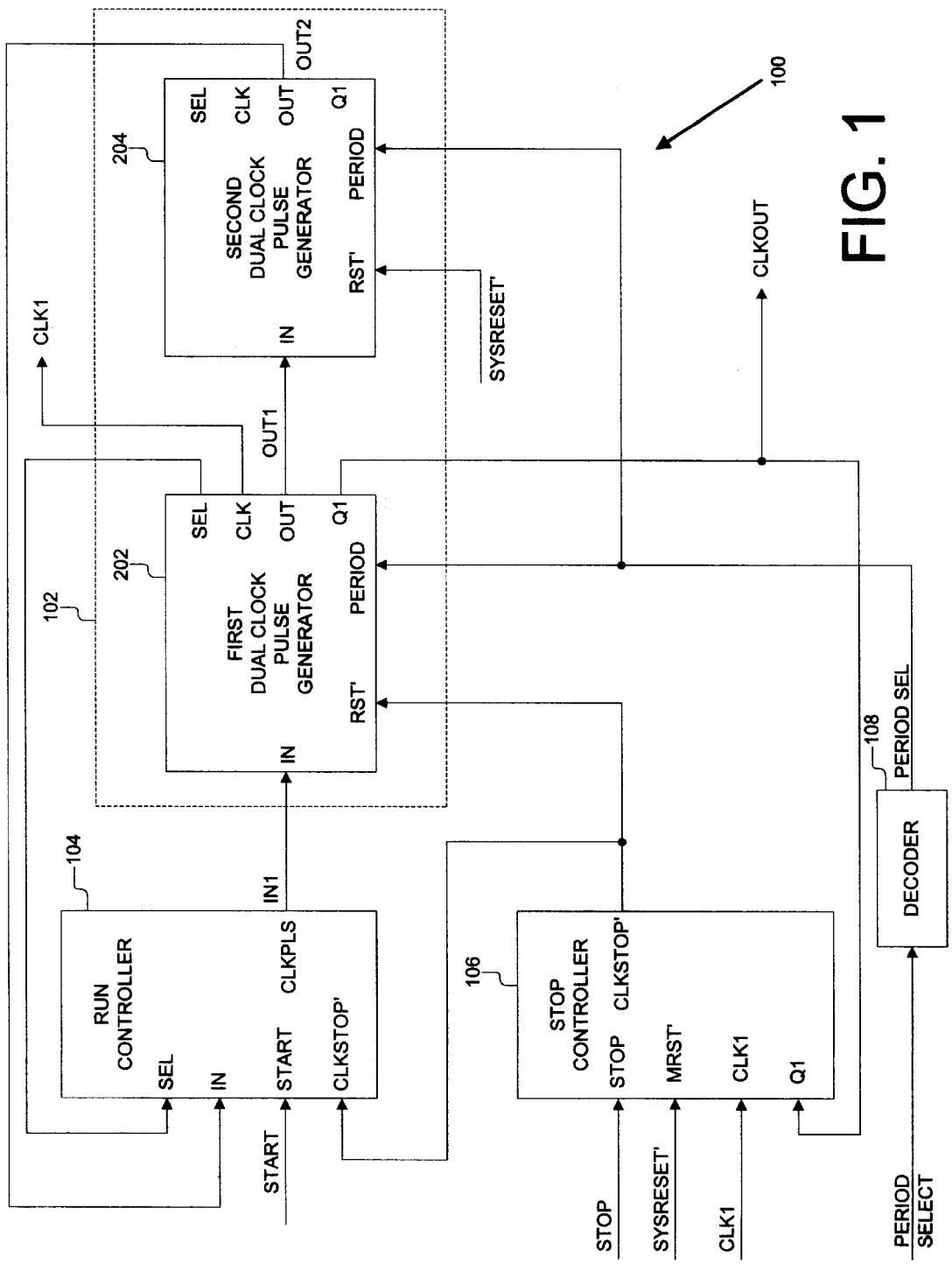
FIG. 1 is a block diagram of a preferred embodiment of the tunable digital oscillator of the present invention.
Figure 2:
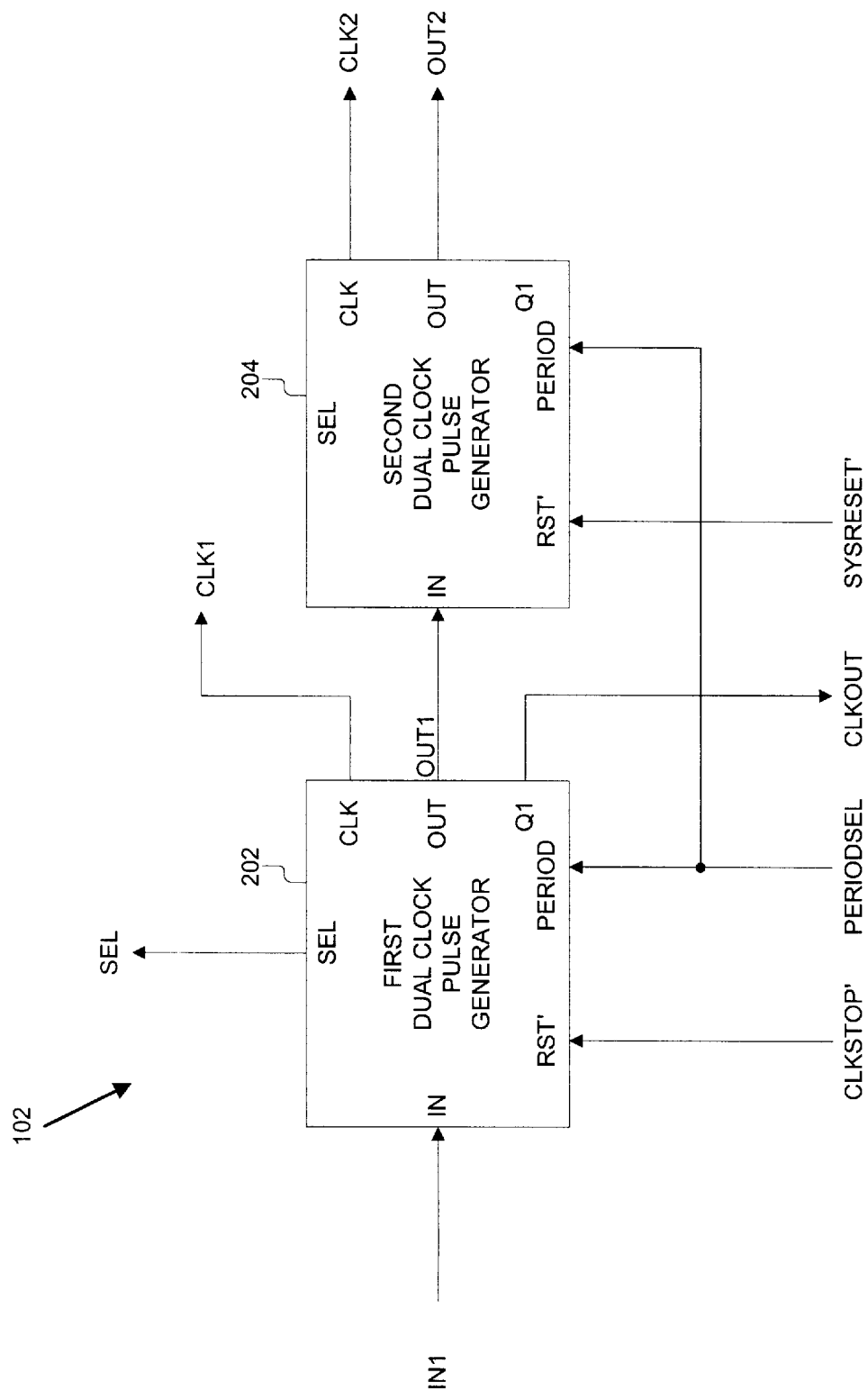
FIG. 2 is a block diagram of a preferred embodiment of a digital pulse generator of the present invention.

Referring now to FIG. 1, a first and preferred embodiment for a tunable digital oscillator 100 constructed according to the present invention is shown. The oscillator 100 of the present invention is preferably constructed entirely with digital logic, thus, the oscillator 100 is particularly advantageous for use in integrated circuits. The oscillator 100 is also tunable or variable, in that, by applying the appropriate control signals, the oscillator 100 will output a clock signal of a different frequency corresponding to the control signal applied. Furthermore, as will be described in more detail below, the oscillator 100 of the present invention is particularly advantageous because it is immune to and even thrives on parasitic effects such as wire loading that typically hinder the preformance of most digital circuits.

As shown in FIG. 1, the tunable digital oscillator 100 preferably comprises a digital pulse generator 102, a run controller 104, a stop controller 106 and a decoder 108. The digital oscillator 100 preferably receives as inputs, a start signal to identify when the digital oscillator 100 should start generating a clock output signal, a stop signal to identify when the digital oscillator 100 should discontinue generating a clock output signal, a system reset signal, and a period signal that specifies a frequency for the clock output signal output by the digital oscillator 100. Those skilled in the art will recognize that these control signals could be provided by other logic such as that used with graphic controllers.

The digital pulse generator 102 is preferably formed from a pair of dual-clock pulse generators 202, 204 that are coupled in a cascasded manner. The dual-clock pulse generators 202, 204 are described in more detail below with reference to FIGS. 2–6. The digital pulse generator 102 generates an output clock signal, CLKOUT, under the control of the run controller 104, the stop controller 106 and the decoder 108. The digital pulse generator 102 provides the particular advantage of being able to start and stop generating the clock signal very quickly. After receiving a start signal, the digital pulse generator 102 generates the clock signal in a matter of nanoseconds and immediately produces a stable clock signal that is glitch free. After receiving the stop signal, the clock signal ceases generating the clock signal within two clock cycles of when the stop signal is received.

The run controller 104 is preferably coupled to receive the start signal, and control the switching "on" of the digital pulse generator 102. The run controller 104 also receives a signal, CLKSTOP', indicating when to discontinue outputting control signals used to generate the clock signal. The CLKSTOP' signal is provided to the run controller 104 by coupling an input of the run controller 104 to an output of the stop controller 106. The CLKSTOP' signal is generated by the stop controller 106 in response to a STOP signal or a reset signal. The run controller 104 also has a pair of inputs coupled to receive signals from the digital pulse generator 102. In particular, the run controller 104 receives a select signal, SEL, and an output signal, OUT2. These signals are used by the run controller 104 to time the transitions on the control signal, IN1, output by the run controller 104 and also to provided a feedback loop for use of the output signal, OUT2, to maintain the digital pulse generator 102 in a state of generating pulses. This will be described in more detail below with reference to FIG. 7 and the timing diagram of FIG. 8.

The stop controller 106 is preferably coupled to receive the stop signal from a controlling processor or logic (not shown). The stop controller 106 controls the switching "off" of the digital pulse generator 102. The stop controller 106 also receives a reset signal, SYSRESET', indicating when the system in which the tunable digital oscillator 100 has been incorporated is reset. Such assertion of the reset signal causes the digital oscillator 100 to be reset to a state of not generating a clock signal. The stop controller 106 also has a pair of inputs coupled to receive signals from the digital pulse generator 102. In particular, the stop controller 106 receives a clock signal, CLK1, and output clock signal, CLKOUT. These signals are used by the stop controller 106 to time the transitions on the control signal, CLKSTOP', output by the stop controller 106 that is provided to both the run controller 104 and the digital pulse generator 102. These signals will be described in more detail below with reference to FIG. 9 and the timing diagram of FIG. 10.

The final component of the tunable digital oscillator 100 is the decoder 108. While the present invention is described herein and below in terms of a tunable digital oscillator 100 that is capable of outputting (or not outputting) one of eight frequencies, those skilled in the art will recognize that the principles of the present invention can be expanded to a tunable digital oscillator 100 that is able to provide any number of different clock frequencies from 2 to n. The preferred embodiment of the present invention preferably receives a signal identifying the period or frequency of the clock signal that is to be output. The decoder 108 translates the input control signal into a plurality of signals, each select signal adding to the period of the clock signal output. More specifically, the decoder 108 is described here as receiving a three-bit control signal and outputting eight signals representing as a group the period of the clock signal to be generated and output. These eight signal are provided to the digital pulse generator 102.

Referring now to FIGS. 2–6, a key compent of the present invention, the digital pulse generator 102, will be described. As noted above, the digital pulse generator 102 preferably comprise a pair of cascaded dual-clock pulse generators 202, 204. As shown, the first and second dual-clock pulse generators 202, 204 are the same with the output of the first dual-clock pulse generator 202 coupled to the input of the second dual-clock pulse generator 204. Each dual-clock pulse generator 202, 204 has a control input for receiving a start or input clocking signal, a reset input (RST') for receiving a reset signal, and a period input for receiving a period selection signal. The data input of the first dual-clock pulse generator 202 is coupled to receive the IN1 signal or the start pulse from the run controller 104. The reset input of the first dual-clock pulse generator 202 is coupled to receive the clock stop signal from the stop controller 106. This allows the stop controller to reset the first dual-clock pulse generator 202 to a state where no clock signal is produced.

The period input of the first dual-clock pulse generator 202 is coupled to receive the period select signal (PERIOD SEL) from the decoder 108. Similarly, the period input of the second clock pulse generator 204 is coupled to receive the period select signal (PERIOD SEL) from the decoder 108. The reset input of the second dual-clock pulse generator 204 is coupled to receive the system reset signal (SYSRESET').

Each of the dual-clock pulse generators 202, 204 also provides a plurality of outputs including a clock output (CLK) that is an internal clock of the dual-clock pulse generator (from FIG. 4, CLK will either be IN or OUT depending on the state of SEL), a Q1 output that is a signal produced by toggling a flip-flop clocked by the clock output signal (CLK), a select output that is the Q1 output delayed by a predetermined amount of time, δ1, and a final output (OUT) that is the select output delayed by a predetermined amount of time, δ2. The Q1 output of the first dual-clock pulse generator 202 preferably provides the clock signal generated by the present invention and is labeled CLKOUT. The Q1 output of the first dual-clock pulse generator 202 is used as the output clock because the first dual-clock pulse generator 202 starts toggling almost immediately after the START signal is applied, thus, this makes the output clock available as soon as possible. If the Q1 output of the second dual-clock pulse generator 204 were used as the CLKOUT signal, there would be a long delay between when the START signal is applied and CLKOUT starts toggling because the first dual-clock pulse generator 202 must go through a complete toggling cycle before the second dual-clock pulse generator 204 begins toggling. Moreover, the Q1 output of the first dual-clock pulse generator 202 is used as the output clock since the stop controller 106 is set up to use the Q1 output of the first dual-clock pulse generator 202. The select output and the clock output of the first dual-clock pulse generator 202 are provided as the SEL input to the run controller 104 and the CLK1 signal to the stop controller 106, respectively. The output (OUT) of the second dual-clock pulse generator 202 provides the OUT2 signal that is fed back and coupled to the IN input of the run controller 104.

Figure 3:
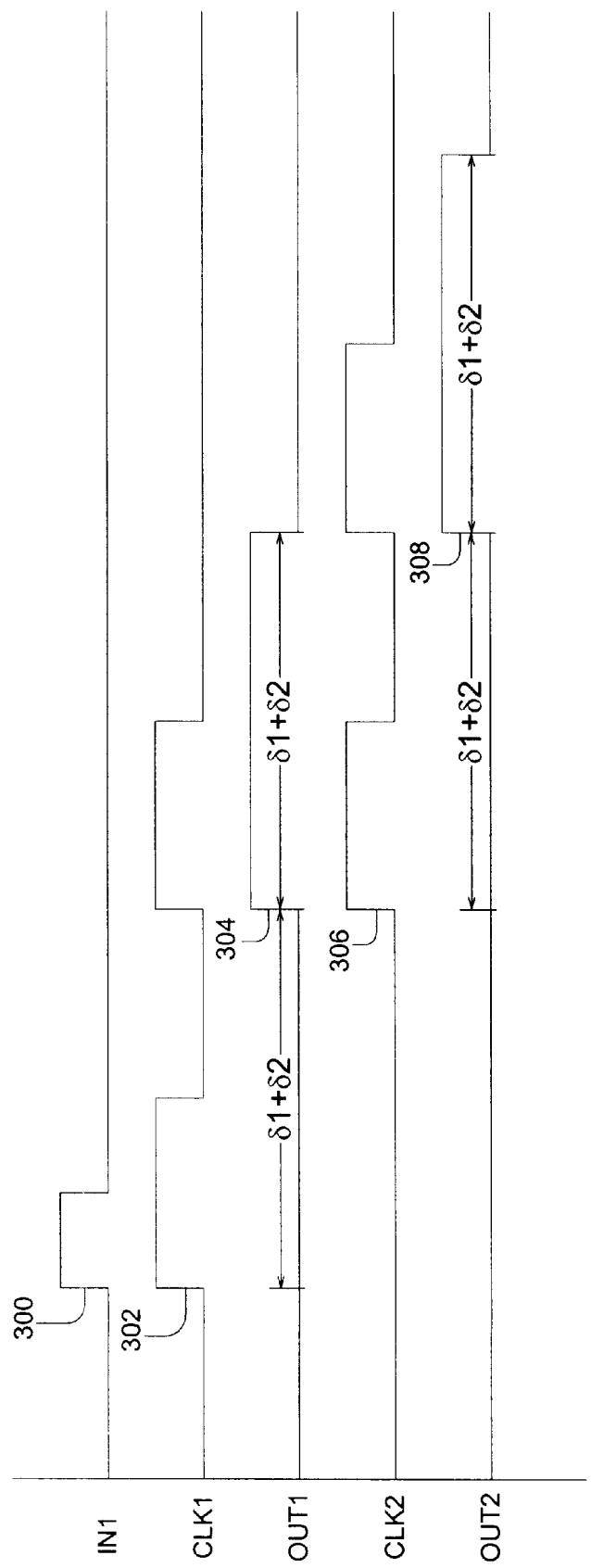
FIG. 3 is a timing diagram for signals received and output by the digital pulse generator of the present invention.

The output signals from the first and second dual-clock pulse generators 202, 204 and their relationship to the input signal IN1 can best be understood with reference to the timing diagram shown in FIG. 3. FIG. 3 shows a timing diagram of the IN1, CLK1, OUT1 (from the first dual-clock pulse generator 202), CLK2 and OUT2 (from the second dual-clock pulse generator 204). The timing diagram shows the signals assuming that the SYSRESET' signal is asserted and then released just before the first rising edge of the IN1 signal. As shown, the first rising edge 300 of the IN1 causes the CLK1 signal to immediately transition to high 302, and then after a predetermined amount of delay equal to δ1+δ2, as will be explained below, causes the OUT1 signal to transition to high 304. Since the OUT1 and CLK2 have a similar relationship to each other as the IN1 and CLK1 signals, the CLK2 signal transitions to high 306 just after the OUT1 signal to transitions to high 304. The OUT1 signal is used to create the OUT2 pulse by cascading the dual-clock pulse generators 202, 204. The feedback method of OUT2 as an input to the first dual-clock pulse generators 202 via the run controller 104 is used to generate an additional OUT1 pulse. This will in turn generate an additional OUT2 pulse that again is fed back to the first dual-clock pulse generator 202 via the run controller 104, thus generating an infinite number of pulses until the reset is asserted.

Figure 4:
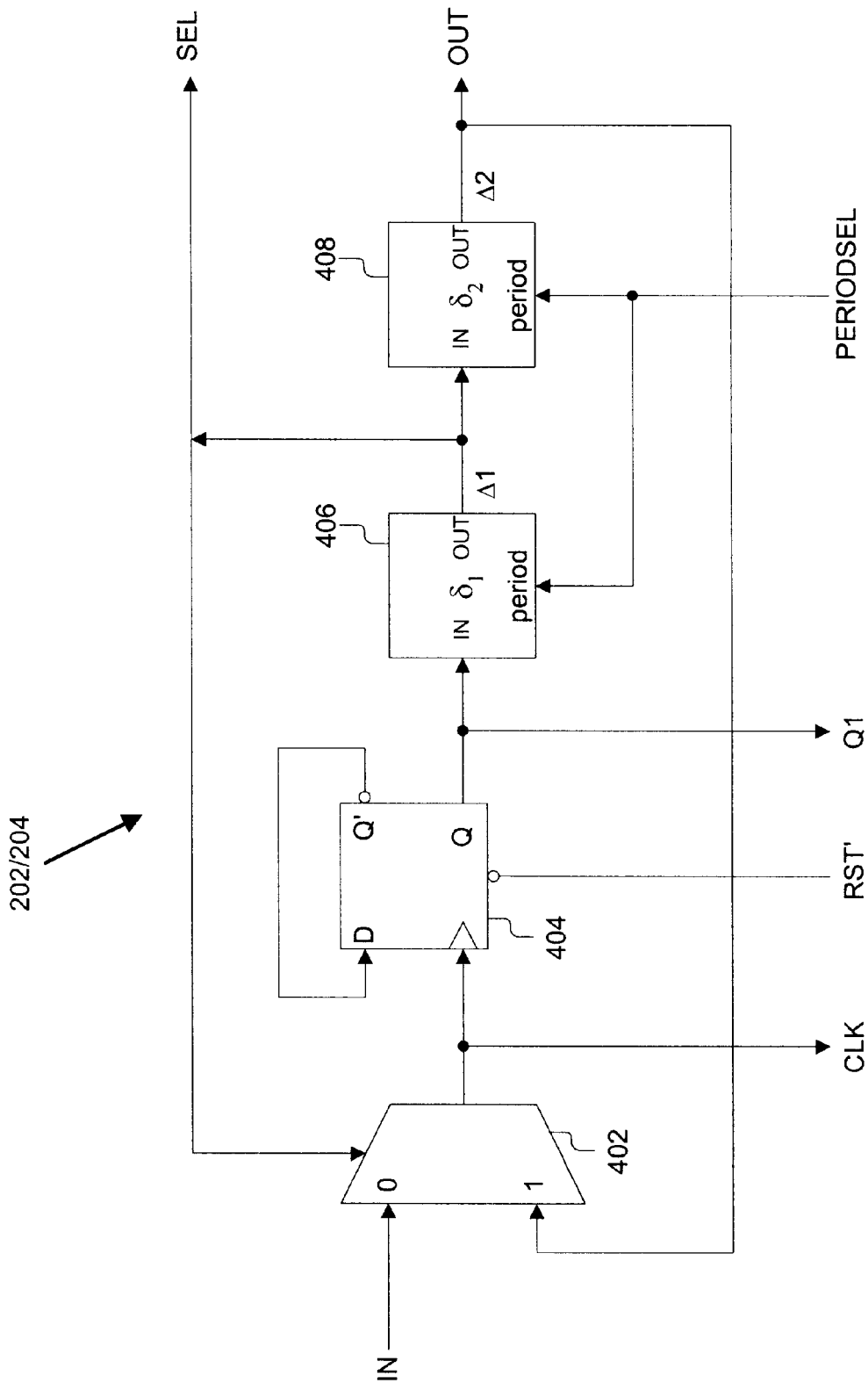
FIG. 4 is block diagram of a preferred embodiment for a dual-clock pulse generator of the present invention.

Referring now to FIG. 4, a preferred embodiment for the dual-clock pulse generators 202, 204 is shown. Since the dual-clock pulse generators 202, 204 are identical in functionality, the dual-clock pulse generators 202, 204 will be described in terms of the first dual-clock pulse generator 202. However, all the functionality of the second dual-clock pulse generator 204 is the same. The only difference in the dual-clock pulse generators 202, 204 is the coupling of their inputs and the outputs.

As shown in FIG. 4, the first dual-clock pulse generator 202 preferably comprises a multiplexer 402, a flip-flop 404, a first variable delay network 406 and a second variable delay network 408. The mutiplexer 402 is preferably a two-to-one multiplexer and has a first and second data inputs, a control input and an output. A first input of the mutiplexer 402 provides the IN input to the first dual-clock pulse generator 202 and is coupled to the CLKPLS output of the run controller 104. The second input of the mutiplexer 402 is coupled to receive a feedback signal from an output of the second variable delay network 408. The control input of the mutiplexer 402 is coupled to an output of the first variable delay network 406 to receive a select signal. Finally, the output of the mutiplexer 402 is coupled to a clock input of the flip-flop 404 and also provides the CLK output of the first dual-clock pulse generator 202.

The signal selected for output by the multiplexer 402 is used to clock the flip-flop 404. The flip-flop 404 is preferably a positive edge triggered D-flip-flop and has a data input, a reset input, and both an output Q and an inverted output Q'. The data input of the flip-flop 404 is coupled to the Q' output such that the flip-flop 404 will toggle its output between "0" and "1" when it is clocked. The reset input is coupled to receceive the CLKSTOP' signal from the stop controller 106. Assertion of the reset input operates in a conventional manner to set the Q output of flip-flop 404 to "0". The output of the flip-flop 404 is coupled to the input of the first variable delay network 406, and also provides the Q1 output of the first dual-clock pulse generator 202.

The first and second variable delay networks 406, 408 are preferably identical in functionality. Each of the variable delay networks 406, 408 has a data input, a period input, and an output. The variable delay networks 406, 408 receive a signal at their inputs and output the signal after a specified delay. The specified time of delay is set in response to the signal applied at the period input. In an exemplary embodiment, each delay network can delay the signal by amounts of time between a predetermined amount of time (x) and eight times the predetermined amount of time (8x). The input of the first variable delay network 406 is coupled to the Q output of the flip-flop 404. The period input of first variable delay network 406 is coupled to the period input of the second variable delay network 408 and to the output of the decoder 108 to receive the PERIOD SEL signal that identifies the specified amount of delay time. The delay time through the first variable delay network 406 is denoted as δ1. The output of the first variable delay network 406 is also coupled to the control input of the multiplexer 402 and is provided as the SEL output. In the case of the first variable delay network 406 this SEL output is coupled to the SEL input of the run controller 104. The second variable delay network 408 has its input coupled to the output of the first variable delay network 406. The second variable delay network 408 receives the PERIOD SEL signal at its period input as noted above. The second variable delay network 408 delays the signal by about the same amount of time as the first variable delay network 406 in this embodiment, and the delay time through the second variable delay network 408 is denoted by δ2. This is done to provide a 50% duty cycle on the output of the second variable delay network 408 and at the clock input of flip-flop 404. The output of the second variable delay network 408 is fed back and coupled to the second input of the multiplexer 402. The output of the second variable delay network 408 also provides the OUT output of the first dual-clock pulse generator 202.

Figure 5:
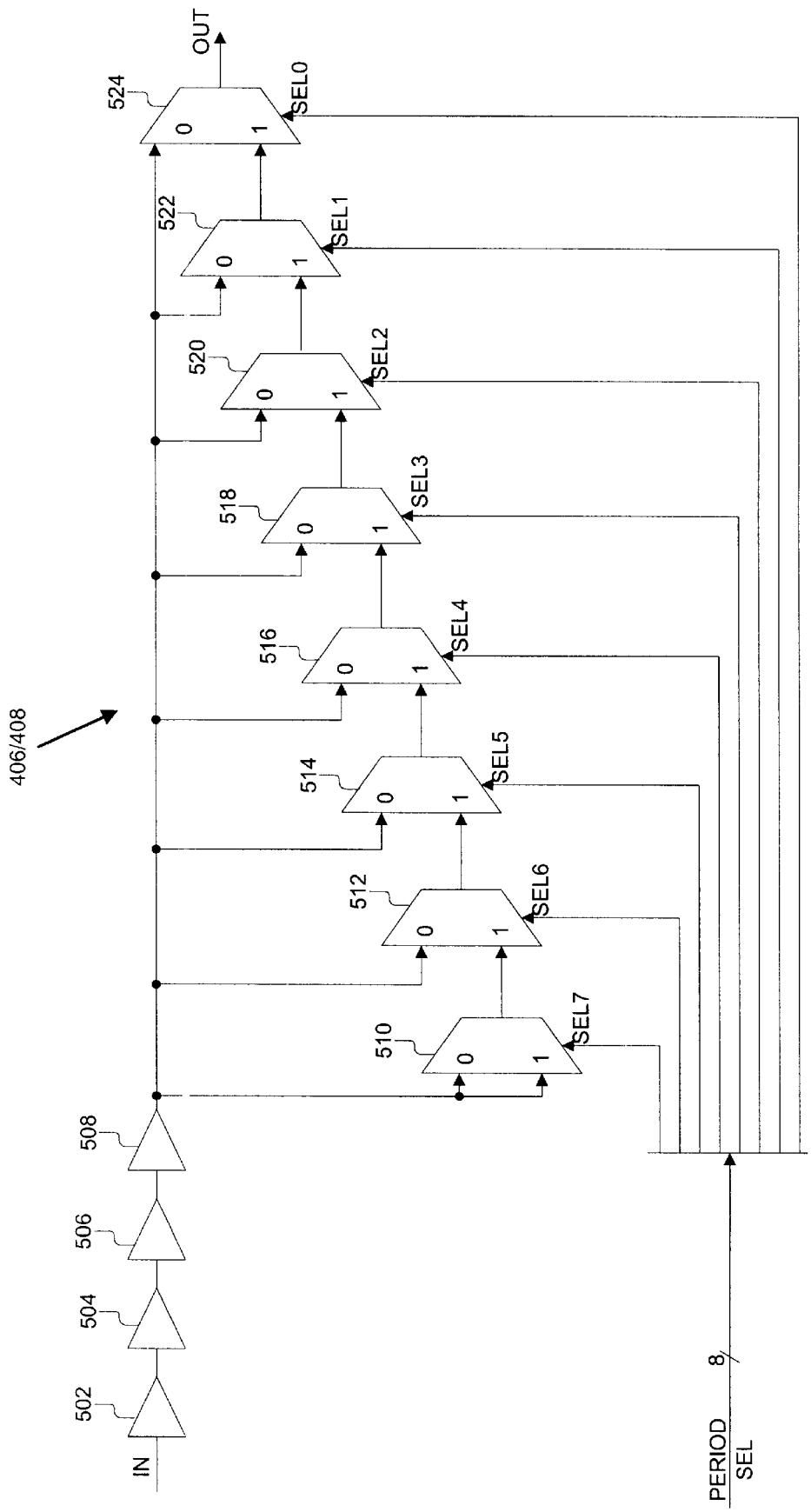
FIG. 5 is block diagram of a preferred embodiment for a variable delay network constructed according to the present invention.

Referring now to FIG. 5, one embodiment for the first variable delay network 406 is shown. While this embodiment of the variable delay network 406 provides eight different possible delays (eight level variable delay network) for the signal applied at the input, those skilled in the art will understand that this design could be modified to include any number of delays from a predetermined minimum to n times the predetermined minimum. For example, the embodiment of FIG. 5 could easily have additional levels to provide greater frequency range. In yet another embodiment, 16 delay levels were provided to generate tunability in the range of 50 MHz to 120 MHz.

As shown in FIG. 5, the first variable delay network 406 preferably comprises a plurality of buffers 502, 504, 506, 508, and a plurality of multiplexers 510, 512, 514, 516, 518, 520, 522, and 524. Each of the buffers 502, 504, 506, 508 has an input and an output. A first buffer 502 has its input coupled to receive the input signal, and its input is the input for the first variable delay network 406. The remaining buffers 504, 506, 508 are coupled in series with the first buffer 502 with the final buffer 508 providing an output. There are preferably four buffers, however, those skilled in the art will recognize that any number of buffers may be provided depending on the minimum time delay desired for the first variable delay network 406. The minimum delay provided by the first variable delay network 406 is determined by the propagation delay through the plurality of buffers 502, 504, 506, 508 plus the progation delay through at least one multiplexer 524. The plurality of multiplexers 510, 512, 514, 516, 518, 520, 522, and 524 each have a first and second data input, a control input and an output. Each of the plurality of multiplexers 510, 512, 514, 516, 518, 520, 522, and 524 has its first data input coupled to the output of the buffer 508. The second data input of one multiplexer 510 has its second data input also coupled to the output of the buffer 508. The remaining multiplexers 512, 514, 516, 518, 520, 522, and 524 each have their second data input coupled to the output of a previous multiplexer 510, 512, 514, 516, 518, 520, and 522. For example, the output of multiplexer 510 is coupled to the second data input of multiplexer 512, and output of multiplexer 512 is coupled to the second data input of multiplexer 514, and similarly for multiplexers 516, 518, 520, 522, and 524. Each of the control inputs of the plurality of multiplexers 510, 512, 514, 516, 518, 520, 522, and 524 is coupled to receive a control signal that forms the eight lines of the period select signal. As has been described above, the decoder 108 translates a three-bit value into one of eight eight-bit values to control the plurality of multiplexers 510, 512, 514, 516, 518, 520, 522, and 524. The table below shows the period select signal values, the PERIOD SEL values and the multiplexers 510, 512, 514, 516, 518, 520, 522, and 524 through which the signal is routed in response to each signal.

| Period Select signal | PERIOD SEL signal | Multiplexer |
|---|---|---|
| 000 | 00000000 | 524 |
| 001 | 00000001 | 522, 524 |
| 010 | 00000011 | 520, 522, 524 |
| 011 | 00000111 | 518, 520, 522, 524 |

-continued

| Period Select signal | PERIOD SEL signal | Multiplexer |
|---|---|---|
| 100 | 00001111 | 516, 518, 520, 522, 524 |
| 101 | 00011111 | 514, 516, 518, 520, 522, 524 |
| 110 | 00111111 | 512, 514, 516, 518, 520, 522, 524 |
| 111 | 01111111 | 510, 512, 514, 516, 518, 520, 522, 524 |

The present invention in essence varies the period by changing the amount of delay provided by the first variable delay network 406. This is done by increasing or decreasing the propagation delay through the first variable delay network 406. The propagation delay is increased by the multiple buffers 502, 504, 506, 508 in part, but particularly by adding the number of multiplexers 510, 512, 514, 516, 518, 520, 522, 524 through which an input signal must pass. For example, an input signal may pass through as few as one multiplexer 524, or be forced to pass through all eight multiplexers 510, 512, 514, 516, 518, 520, 522, 524. This is very advantageous since any parasitic effects such as wire loading only increase the delay through the first variable delay network 406 thus adding or making the first variable delay network 406 immune from such effects. While the present invention has been described in terms of having eight multiplexers 510, 512, 514, 516, 518, 520, 522, 524, those skilled in the art will recognize that the first variable delay network 406 may have any number of multiplexers depending on the amount of tunability in period desired. Those skilled in the art will further recognize that various other devices may be used to provide the propogation delay other than multiplexers.

Figure 6:
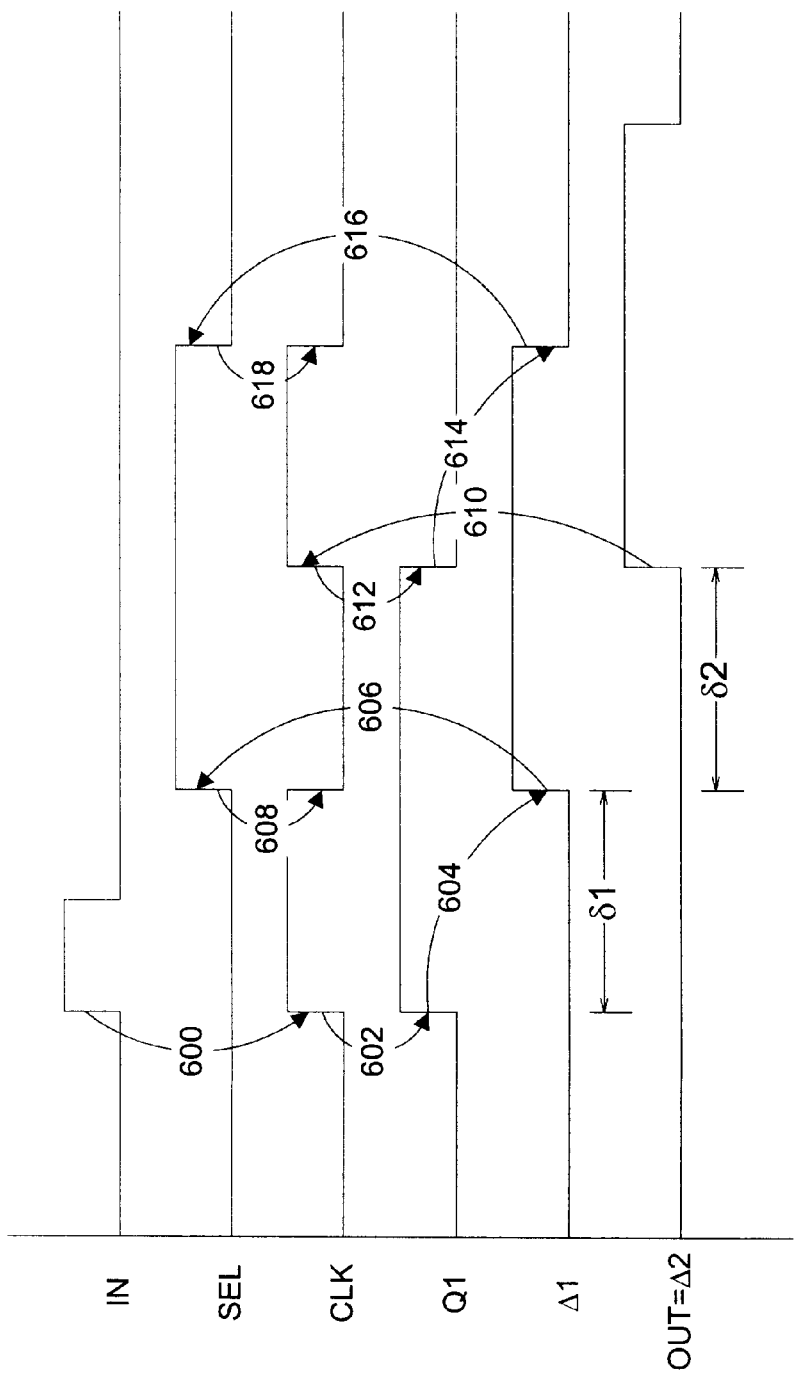
FIG. 6 is a timing diagram for signals received and output by the dual-clock pulse generator of the present invention.

Referring now to the timing diagram of FIG. 6 and back to FIG. 4, the operation of the first dual-clock pulse generator 202 will be described in more detail. The first dual-clock pulse generator 202 operates continuously to generate a series of pulses as long as the delay provided by the first variable delay network 406, δ1, and the delay time through the second variable delay network 408, δ2, are sufficient to create CLK1 pulses that satisfy the minimum pulse width required for the clock input of flip-flop 404. This is a simple requirement and can be easily satisfied in most modern process technologies by using only 20 buffers coupled in series. For example, in the process technology that this invention was first realized, the worst case minimum pulse width requirement for a D-flip flip is around 0.8 ns. The intrinsic pin-to-pin delay of a typical buffer is around 0.2 ns. So, 20 buffers connected in series would give a delay of 20×0.2 ns=4 ns minimum. If such a delay were used for each delay network in FIG. 4, CLK pulses would be created with a high time of 4 ns minimum and a low time of 4 ns minimum. This is more than sufficient time to meet the requirements of the present invention. Of course, wireloading effects would only add to the delay, helping to satisfy these requirements. Moreover, since delays and flip-flop timing requirements usually scale with process technologies this design virtually guarantees proper operation even when the design is translated from one process technology to the next process technology. As shown in FIG. 6, the process for generating pulses begins with a transition from low to high on the input (IN) to the first dual-clock pulse generator 202. As with the prior timing diagram, it is assumed that flip-flop 404 is reset prior to the first rising edge on the IN signal. The transition from low to high on the input (IN) to the first dual-clock pulse generator 202 propagates 600 through the multiplexer 402 and provides a rising edge at the clock input of the flip-flop 404. This causes the flip-flop 404 to latch the data at its D input in turn causing 602, the Q1 output, to transition to high. Once the Q1 output has transitioned to high and after the propagation delay, δ1, through the first variable delay network 406, the output Δ1 of the first variable delay network 406 transitions to high 604. Since the output Δ1 is also the select signal SEL, the SEL signal transitions to high 606. The select signal controls the multiplexer 402 such that output by the multiplexer is switched to the second input, or the current value of the OUT or output Δ2. When the select signal is low, the input (IN) to the first dual-clock pulse generator 202 is provided at the output of the multiplexer 402 and when the select signal is high, output Δ2 is provided at the output of the multiplexer 402. Since the value of output Δ2 is low, the CLK signal transitions 608 to low after the SEL signal transitions high. After the rising edge on the output Δ1, the output of the second variable delay network 408 transitions to high after the propagation delay, δ2, through the second variable delay network 408. This rising edge on the output of the second variable delay network 408 is fed back 610 as a rising edge on the CLK signal since the multiplexer passes the output Δ2 signal through as the CLK signal. This in turn provides a second rising edge at the clock input of the flip-flop 404 causing the flip-flop 404 to latch for a second time. This causes the flip-flop 404 to toggle the data at its D input which is now low in turn causing 612, the Q1 output to transition to low. Once the Q1 output has transitioned to low, this change in signal state is passed 614 through the first variable delay network 406 and after time δ1, the output Δ1 of the first variable delay network 406 transitions to a low state. This immediately causes 616 a change in the state of the SEL signal to low. This causes the CLK signal to transition to low, or the current value of the input signal (IN) to the first dual-clock pulse generator 202. Thus, the first dual-clock pulse generator 202 will generate two such pulses (CLK) each time an input pulse (IN) is provided at its input. Since as shown in FIG. 1 the OUT signal, or Δ2, is provided to the run controller 104, this signal can be used to generate additional input clock pulses as will be described below.

Figure 7:
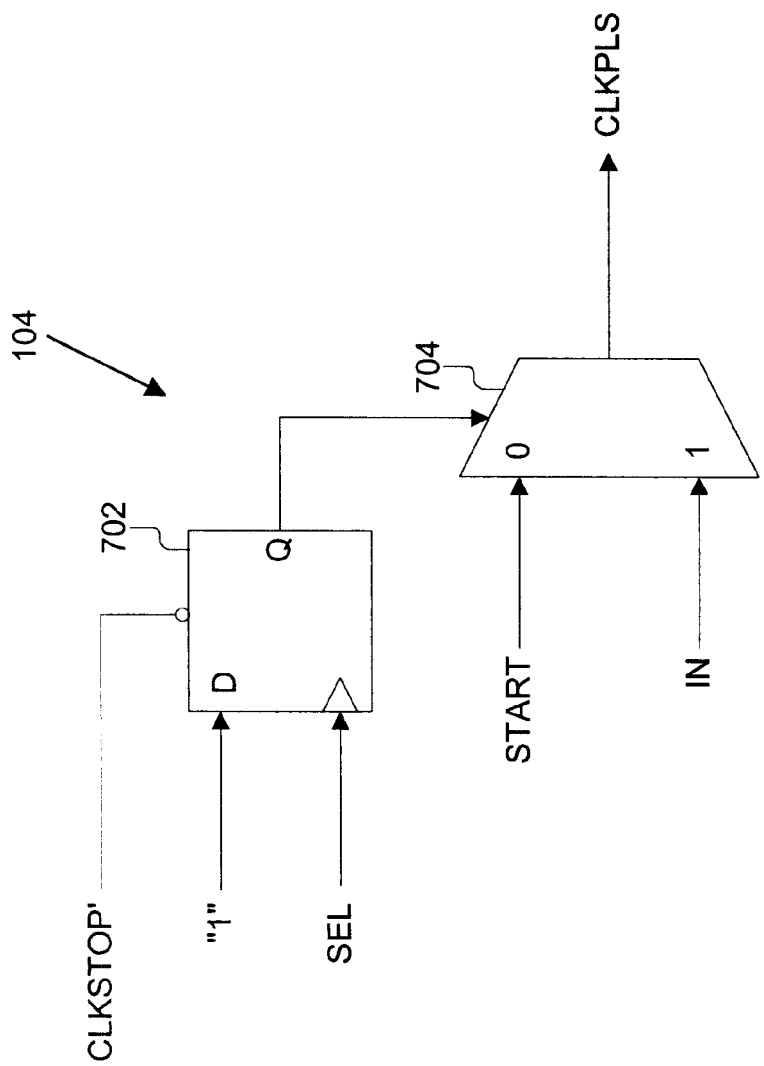
FIG. 7 is block diagram of a preferred embodiment for a run controller constructed according to the present invention.

Referring now to FIG. 7, a preferred embodiment for the run controller 104 is shown. The run controller 104 preferably comprises a flip-flop 702 and a multiplexer 704. As has been noted above, the run controller 104 has a clock stop input, a select input, a START input and data IN input. The reset input to the flip-flop 702 provides the clock stop input and is coupled to receive the CLKSTOP' signal from the stop controller 106. The clock input of the flip-flop 702 provides the select input and is coupled to receive the SEL signal. The data input to the flipflop 702 is tied high. The output of the flip-flop 702 is coupled to the control input of the multiplexer 704. The multiplexer 704 provides the remaining inputs of the run controller 104 and the output for the run controller 104. The multiplexer 704 has a first input that is provided at its output when the control signal applied at the control input is low and a second input that is provided at its output when the control signal applied to the control input is high. The first input of the multiplexer 704 is coupled to receive the START signal from a source external to oscillator 100. The second input of the multiplexer 704 is coupled to receive the OUT2 signal output by the second dual-clock pulse generator 204. The output of the multiplexer 704 provides the output of the run controller 104, and thus, the CLKPLS signal.

After receiving a CLKSTOP' signal, the flip-flop 702 is reset to output a low signal, and thus the run controller 104 is set to output the signal at its START input on its CLKPLS output as the IN1 signal. As has been noted above with reference to FIGS. 4 and 6, a rising edge on the START signal is passed to the first dual-clock pulse generator 202. After time delay δ1, this causes the SEL signal output by the first dual-clock pulse generator 202 to transition to high. The rising edge on the SEL signal is applied to the clock input of the flip-flop 702 which clocks the flip-flop 702 and it outputs a high or "1". This affects the multiplexer 704 such that the second input (which is provided from the OUT2 output of the second dual-clock pulse generator 204) is now provided as the CLKPLS output (e.g., as the IN1 signal). Thus, after the START pulse triggers the first dual-clock pulse generator 202 to toggle its SEL, CLK, OUT and Q1 outputs, the input IN is always provided as the IN1 signal to the first dual-clock pulse generator 202. In this manner, the OUT2 signal provided by the second dual-clock pulse generator 204 is then fed back to the first dual-clock pulse generator 202 through the run controller 104 to continue generating clock pulses as has been described above with reference to FIGS. 4 and 6. It should be noted that the duration of the START pulse is unimportant as long as it is high long enough to meet the minimum clock pulse width requirements of flip-flop 404 of first dual clock pulse generator 202. The only other requirement is that START be low when the CLKSTOP' signal is asserted.

Figure 8:
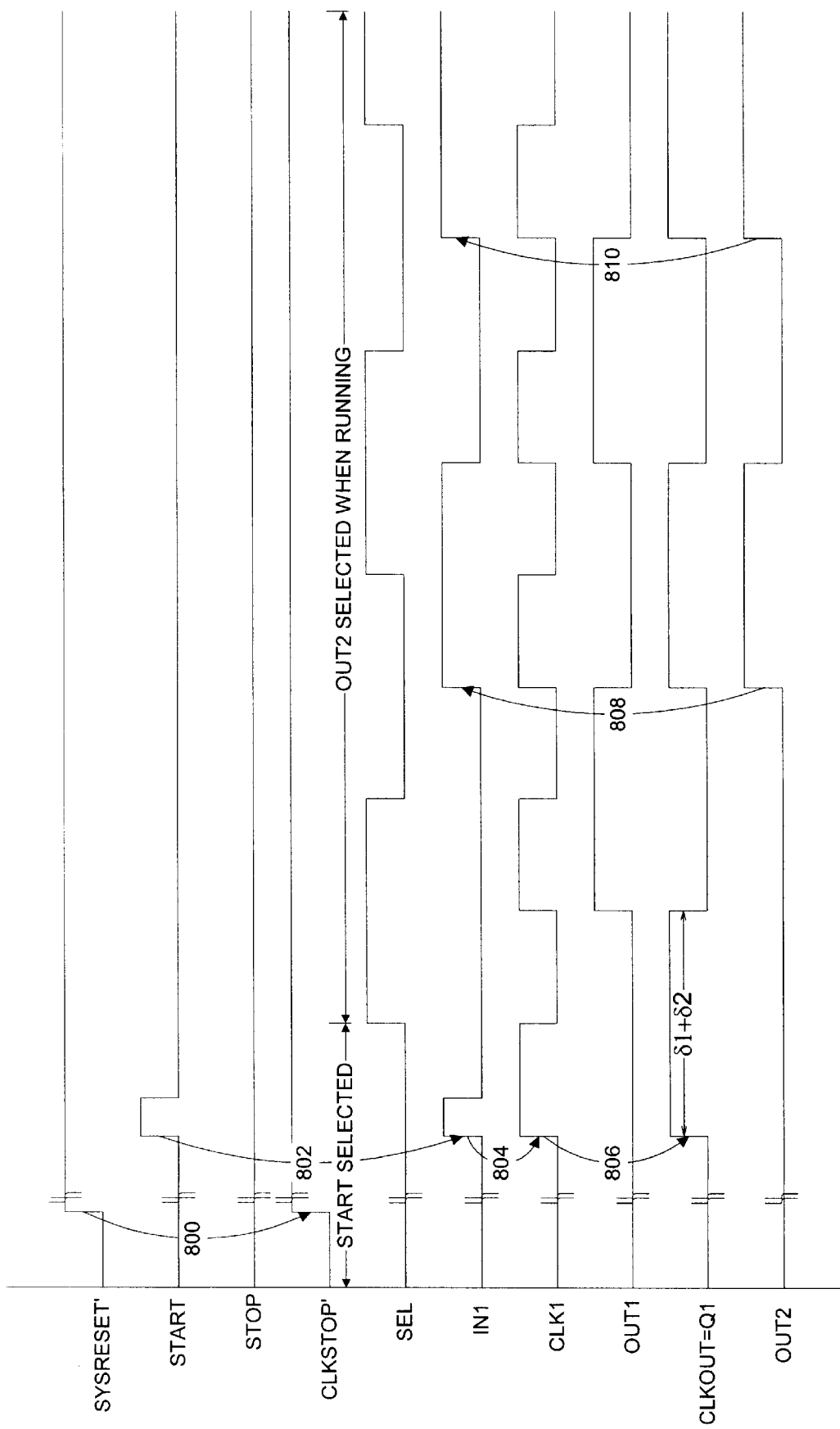
FIG. 8 is a timing diagram illustrating the sequence of signals generated by the present invention starting up the tunable digital oscillator of the present invention.

The operational sequence for starting the oscillator 100 can best be understood with reference to the timing diagram shown in FIG. 8. For convenience and ease of understanding, FIG. 8 illustrates the relevant input signals received from the run controller 104 as well as the signal output received by the first dual-clock pulse generator 202 and the second dual-clock pulse generator 204. The oscillator 100 begins in an "off" state that is maintained by assertion of the CLKSTOP' signal and the SYSRESET' signals (asserted low). The oscillator 100 then transitions to a state where operation is possible, dependent on receiving a pulse on the START signal. This state is denoted by arrow 800 that highlights the CLKSTOP' signal and the SYSRESET' signals transitioning to high. The oscillator 100 continues in this state until a rising edge on the START signal is received. Once a rising edge on the START signal is received as indicated by arrow 802, the run controller 104 transitions the IN1 signal to high, which in turn causes 804 the CLK1 signal provided by the first dual-clock pulse generator 202 to transitions to high. The CLKOUT signal from the first dual-clock pulse generator 202 also transitions to high once the IN1 signal transitions. Thereafter, the signals produced by the first and second dual-clock pulse generators 202, 204 have been described with reference to the timing diagram of FIG. 6. One point of interest is that the SEL signal output by the first dual-clock pulse generator 202 has about a 50% duty cycle and transitions between high and low. Once running, OUT2 is always selected by the run controller 104 to be the input of the first dual clock pulse generator 202. Internal to the first dual clock pulse generator 202, the SEL signal alternately selects IN1 (OUT2 from FIG. 1) or OUT of FIG. 4. As shown by arrows 808 and 810, the rising edges on the OUT2 signal are thereafter used to generate an infinite number of clock pulses and continue the cycle as long as the SYSRESET' and CLKSTOP' signals remain high.

Figure 9:
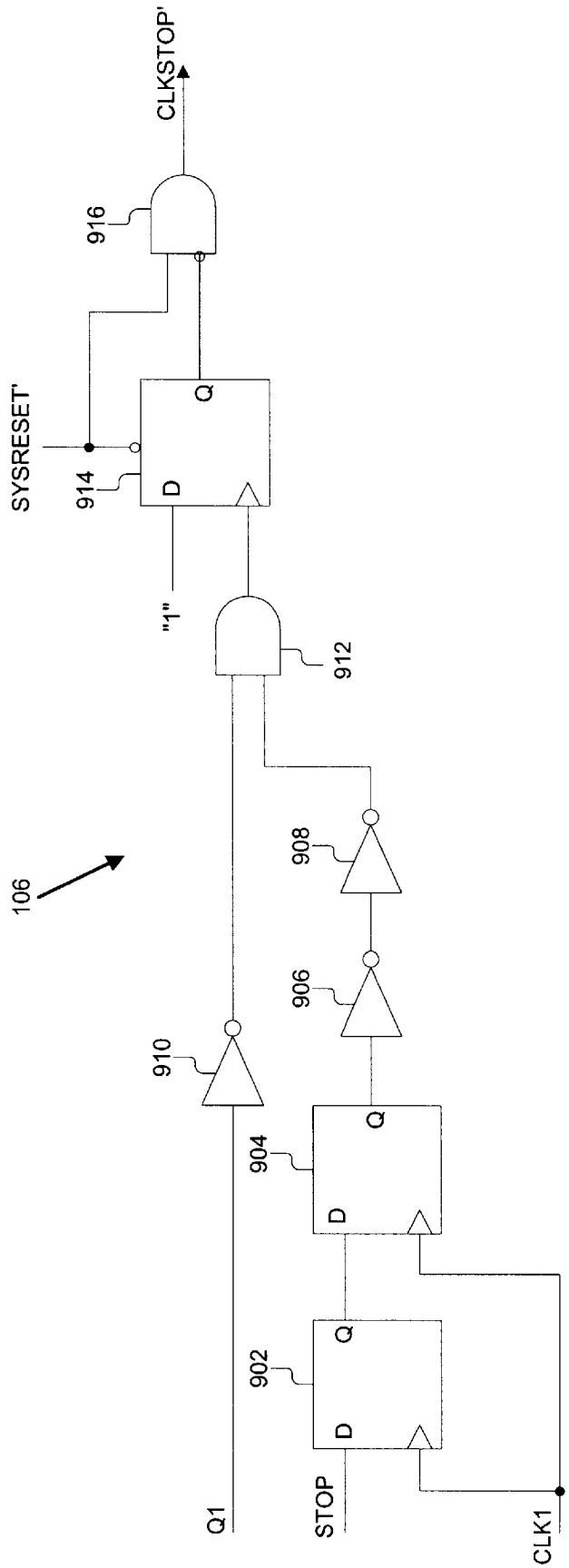
FIG. 9 is a block diagram of a preferred embodiment for a stop controller constructed according to the present invention.

Referring now to FIG. 9, a preferred embodiment for the stop controller 106 is shown. The stop controller 106 preferably comprises a plurality of flip-flops 902, 904, 914, and other combinational logic 906, 908, 910, 912 and 916. As has been noted above, the stop controller 106 has a stop input, a first clock (CLK1) input, a Q1 input and a reset input. The data input of the first flip-flop 902 is coupled to receive the STOP input signal. The output of the first flip-flop 902 is coupled to the data input of the second flip-flop 904. The clock input to both the first and second flip-flops 902, 904 is coupled to receive the CLK1 signal from the first dual-clock pulse generator 202. More importantly, flip-flops 902, 904 synchronize the STOP signal with the CLK1 signal. This is advantageous because it allows STOP to be asserted at anytime, without regard for any clock domain. The output of the second flip-flop 904 is coupled by a pair of inverters 906, 908 in series to an input of an AND gate 912. The inverters 906, 908 are needed to prevent possible glitches at the clock input of the flip-flop 914. They ensure that the second input to the AND gate 912 coupled to the output of inverter 908 only transitions after Q1 transitions. Without inverters 906, 908, the second input to AND gate 912 could go high just before the first input (driven by inverter 910) of the AND gate 912 goes low. This could cause a glitch at the output of the AND gate 912. The other input of the AND gate 912 receives the output of inverter 910 that is coupled to receive the Q1 signal from the first dual-clock pulse generator 202. The output of the AND gate 912 is in turn coupled to the clock input of the third flip-flop 914. Thus, the third flip-flop 914 will receive a rising edge on the clock input when the Q1 signal is low and STOP signal goes high delayed by up to two cycles of the CLK1 signal. The data input is tied to high so that once the third flip-flop 914 is clocked the CLKSTOP' signal will be asserted until a reset signal (in this case a system reset) is received. The reset input of the third flip-flop 914 is coupled to receive the SYSRESET' signal and will reset the stop controller 106. The output of the third flip-flop 914 is input to AND gate 916 with the input inverted along with the system reset signal to provide the CLKSTOP' signal.

Referring now to FIG. 10, the operational sequence for stopping the oscillator 100 is shown. When the SYSRESET' signal is low, the clock stop signal is low since the SYSRESET' signal is input to an input of the AND gate 916. This occurs only during system reset. The SYSRESET' signal transitions to high before the START signal is asserted. This starts the first and second dual-clock pulse generators 202, 204 generating the clock signal. The STOP signal can be asserted at any time since the first and second flip-flops 902, 904 synchronize the signal. The STOP signal is synchronized by the same clock, CLK1, that drives the flip-flop 404 of the first dual-clock pulse generator 202. Furthermore, the CLKSTOP' signal resets the flip-flop 404 of the first dual-clock pulse generator 202, and the signal will only go low when the output of the the flip-flop 404 is zero, thereby preventing any glitches on the output Q1 of the the first dual-clock pulse generator 202 from being produced when the clock is stopped. Moreover, even in the worst case, the CLKSTOP' signal will go low within two CLKOUT cycles to turn off the oscillator. This is best shown by the last falling edge of the CLKOUT signal and its correspondence to the CLKSTOP' signal (arrow 1000 in FIG. 10).

While the present invention has been described with reference to certain preferred embodiments, those skilled in the art will recognize that various modifications may be provided. These and other variations upon and modifications to the preferred embodiments are provided for by the present invention.

What is claimed is:

1. A tunable digital oscillator comprising:
   a first controller having an input and an output for generating a clock pulse signal to start a digital pulse generator and continue generation of an output clock signal, the input of the first controller coupled to receive a start signal;
   a second controller having an input and an output for generating a clock stop signal to discontinue generation of the output clock signal, the input of the second controller coupled to receive a stop signal;
   said digital pulse generator having a first input, a second input, a third input, and an output for generating the output clock signal, the first input of the digital pulse generator coupled to the output of the first controller for receiving the clock pulse signal, the second input of the digital pulse generator coupled to the output of the second controller for receiving the clock stop signal, the third input of the digital pulse generator coupled to receive a plurality of control signals that control the period of the output clock signal, and the output of digital pulse generator providing the output clock signal.

2. The tunable digital oscillator of claim 1 wherein the first controller, the second controller and the digital pulse generator are formed entirely of standard digital logic circuitry.

3. The tunable digital oscillator of claim 1 further comprising a decoder having an input and an output, the decoder for translating a binary value to a plurality of control signals, the input of the decoder coupled to receive the period signal and the output of the decoder coupled to the third input of the digital pulse generator to provide signals that control the period of the plurality of pulses.

4. The tunable digital oscillator of claim 3, wherein the period signal is a three-bit value, the decoder translates a three-bit value into one of eight possible eight bit values, and the period select signal is an eight bit control signal.

5. The tunable digital oscillator of claim 1, wherein the digital pulse generator providing the output clock signal having one of eight different periods.

6. The tunable digital oscillator of claim 1, wherein the digital pulse generator providing the output clock signal having one of sixteen different periods.

7. The tunable digital oscillator of claim 1, wherein:
   the digital pulse generator has a plurality of additional outputs and generates a second clock signal delayed from the output clock signal by one period and a select signal; and
   the first controller has additional inputs, the additional inputs coupled to receive the second clock signal and the select signal, and the first controller uses the select signal to determine whether the start signal or the second clock signal will be used to generate the output clock signal.

8. The tunable digital oscillator of claim 7, wherein the first controller comprises:
   a D flip-flop having a data input, a clock input and an output, the data input of the D flip-flop coupled to receive a high logic signal, the clock input of the D flip-flop coupled to receive the select signal; and
   a multiplexer having a first data input, a second data input, a control input, and output, the control input of the multiplexer coupled to the output of the D flip-flop, the first data input of the multiplexer coupled to receive the start signal, and the second data input of the multiplexer coupled to receive the second clock signal from the digital pulse generator.

9. The tunable digital oscillator of claim 1, wherein:
   the digital pulse generator has an additional output and generates a first clock signal, the output clock signal delayed from the first clock signal by one period; and the second controller has additional inputs, one of said additional inputs coupled to receive the first clock signal from the digital pulse generator, a second of said additional inputs coupled to receive the output clock signal, the second controller using the first clock signal and the output clock signal to time the generation of the clock stop signal.

10. The tunable digital oscillator of claim 9, wherein the second controller comprises:
a first and second D flip-flops coupled in series, a data input to the first D flip-flop coupled to receive the stop signal, the clock inputs of the first and second D flip-flops coupled to receive the first clock signal;
an AND gate having a first input coupled to receive an inverted version of the output clock signal, and the output of the second D flip-flop; and
a third D flip-flop, having a clock input, a data input, and an output, the clock input of the third D flip-flop coupled to an output of the AND gate, and the data input of the third D flip-flop coupled to receive a high logic signal, the output of the third D flip-flop providing the clock stop signal.

11. The tunable digital oscillator of claim 1, wherein the digital pulse generator comprises:
a first dual-clock pulse generator having a data input, a reset input, a period input, a first output and a second output, the first dual-clock pulse generator producing said output clock signal and a second clock output signal 180 degrees out of phase at the first output and the second output in response to an input pulse at the data input to the first dual-clock pulse generator, the data input of the first dual-clock pulse generator coupled to the output of the first controller, the reset input of the first dual-clock pulse generator coupled to the output of the second controller, and the period input of the first dual-clock pulse generator coupled to receive the plurality of control signals; and
a second dual-clock pulse generator having a data input, a period input, and an output, the second dual-clock pulse generator producing a square wave in response to an input pulse at the data input to the second dual-clock pulse generator, the data input of the second dual-clock pulse generator coupled to the first output of the first dual-clock pulse generator, the output of the second dual-clock pulse generator providing said square wave, and the period input of the second dual-clock pulse generator coupled to receive the plurality of control signals.

12. The tunable digital oscillator of claim 11, wherein:
the first dual-clock pulse generator has a select output for providing a select signal that is 90 degrees out of phase from the second output of the first dual-clock pulse generator; and
the first controller has additional inputs, the additional inputs coupled to receive the output of the second dual-clock pulse generator and the select signal of the first dual-clock clock pulse generator, the first controller using the select signal of the first dual-clock pulse generator to determine whether the start signal or the output of said second dual-clock pulse generator will be used to generate the output clock signal.

13. The tunable digital oscillator of claim 11, wherein:
the second controller has additional inputs, one of said additional inputs coupled to an additional output signal of the first dual-clock pulse generator, a second of said additional inputs coupled to the second output of the first dual-clock pulse generator, the stop controller using the additional output signal of the first dual-clock pulse generator and the output clock signal to time the generation of the clock stop signal.

14. The tunable digital oscillator of claim 11, wherein the first dual-clock pulse generator comprises:
a multiplexer having a first data input, a second data input, a control input, and output, the multiplexer selecting one from the first data input and the second data input as a signal to provide on the output, the first data input coupled to the output of the first controller to receive the clock pulse signal; and
a D flip-flop having a data input, a clock input, an output, and an inverted output, the data input of the D flip-flop coupled to the inverted output of the D flip-flop, the clock input of the D flip-flop coupled to the output of the multiplexer;
a first delay network having a data input, a period input, and an output, for delaying a signal applied at the data input by a selected period in response to the control period signals applied at the period input, the data input of the first delay network coupled to the output of the D flip-flop, and the output of the first delay network coupled to the control input of the multiplexer; and
a second delay network having an data input, a period input, and an output, for delaying signals applied at the data input of the second delay network by a selected period in response to the control signals applied at the period input, the data input of the second delay network coupled to the output of the first delay network, and the output of the second delay network coupled to the second data input of the multiplexer.

15. The tunable digital oscillator of claim 14, wherein the first delay network further comprises:
a plurality of buffers coupled in series, the first of said plurality of buffers providing the data input to the first delay network; and
a plurality of multiplexers, each of the multiplexer having a first and a second data inputs, the first data input of each of the plurality of multiplexers coupled to an output of a last buffer in the plurality of buffers, the plurality of multiplexers having the second data input coupled in a cascaded manner to the output of a previous multiplexer from the plurality of multiplexers, a first of the plurality of multiplexer having both the first and second data input coupled to the output of the last buffer in the plurality of buffers.

16. The tunable digital oscillator of claim 14, wherein the second delay network further comprises:
a plurality of buffers coupled in series, the first of said plurality of buffers providing the data input to the second delay network; and
a plurality of multiplexers, each of the multiplexer having a first and a second data inputs, the first data input of each of the plurality of multiplexers coupled to an output of a last buffer in the plurality of buffers, the plurality of multiplexers having the second data input coupled in a cascaded manner to the output of a previous multiplexer from the plurality of multiplexers, a first of the plurality of multiplexer having both the first and second data input coupled to the output of the last buffer in the plurality of buffers.

17. The tunable digital oscillator of claim 11, wherein the second dual-clock pulse generator comprises:
a multiplexer having a first data input, a second data input, a control input, and output, the multiplexer selecting one from the first data input and the second data input as a signal to provide on the output, the first data input coupled to the first output of the first dual-clock pulse generator; and a D flip-flop having a data input, a clock input, an output, and an inverted output, the data input of the D flip-flop coupled to the inverted output of the D flip-flop, the clock input of the D flip-flop coupled to the output of the multiplexer;

a first delay network having a data input, a period input, and an output, for delaying a signal applied at the data input by a selected period in response to the control signals applied at the period input, the data input of the first delay network coupled to the output of the D flip-flop, and the output of the first delay network coupled to the control input of the multiplexer; and a second delay network having an data input, a period input, and an output, for delaying signals applied at the data input of the second delay network by a selected period in response to the control signals applied at the period input, the data input of the second delay network coupled to the output of the first delay network, and the output of the second delay network coupled to the second data input of the multiplexer.

18. A variable pulse generator comprising:

a first dual-clock pulse generator having a data input, a period input, a first output and a second output, the first dual-clock pulse generator producing a pair of square wave pulses 180 degrees out of phase at the first output and the second output in response to an input pulse at the data input to the first dual-clock pulse generator, the data input of the first dual-clock pulse generator coupled to receive an input start pulse the period input coupled to receive a signal used by the first dual-clock pulse generator to set periods of the square wave pulses produced; and a second dual-clock pulse generator having a data input, a period input, an output, the second dual-clock pulse generator producing a square wave in response to an input pulse at the data input to the second dual-clock pulse generator, the data input of the second dual-clock pulse generator coupled to the output of the first dual-clock pulse generator, and the period input of the second dual-clock pulse generator coupled to period input of the first dual-clock pulse generator.

19. The variable pulse generator of claim 18, wherein the first and second dual-clock pulse generator each comprise:

a multiplexer having a first data input, a second data input, a control input, and output, the multiplexer selecting one from the first data input and the second data input as a signal to provide on the output; and a D flip-flop having a data input, a clock input, an output, and an inverted output, the data input of the D flip-flop coupled to the inverted output of the D flip-flop, the clock input of the D flip-flop coupled to the output of the multiplexer;

a first delay network having a data input, a period input, and an output, for delaying a signal applied at the data input by a selected period in response to a signal applied at the period input, the data input of the first delay network coupled to the output of the D flip-flop, and the output of the first delay network coupled to the control input of the multiplexer; and a second delay network having a data input, a period input, and an output, for delaying a signal applied at the data input by a selected period in response to a signal applied at the period input, the data input of the second delay network coupled to the output of the first delay network, and the output of the second delay network coupled to the second data input of the multiplexer.

20. The tunable digital oscillator of claim 19, wherein the first and second delay networks each further comprise:

a plurality of buffers coupled in series, the first of said plurality of buffers providing the data input to the first or second delay network; and a plurality of multiplexers, each of the multiplexer having a first and a second data inputs, the first data input of each of the plurality of multiplexers coupled to an output of a last buffer in the plurality of buffers, the plurality of multiplexers having the second data input coupled in a cascaded manner to the output of a previous multiplexer from the plurality of multiplexers, a first of the plurality of multiplexer having both the first and second data input coupled to the output of the last buffer in the plurality of buffers.

* * * * *